United States Patent [19]

Kumada

[11] 3,990,057

[45] Nov. 2, 1976

[54] FERROELECTRIC ANALOG MEMORY DEVICE AND METHOD OF OPERATING THE SAME

[75] Inventor: Akio Kumada, Kokubunji, Japan

[73] Assignee: Hitachi, Ltd., Japan

[22] Filed: Feb. 4, 1975

[21] Appl. No.: 546,928

[30] Foreign Application Priority Data

Feb. 4, 1974  Japan.................................. 49-13725

[52] U.S. Cl. ............................................. 340/173.2
[51] Int. Cl.²........................................ G11C 11/22
[58] Field of Search ........ 340/173.2, 173 R, 173 SP

[56] References Cited
UNITED STATES PATENTS

| | | | |
|---|---|---|---|
| 3,374,473 | 3/1968 | Cummins.......................... | 340/173.2 |
| 3,623,031 | 11/1971 | Kumada............................ | 340/173.2 |

*Primary Examiner*—Daryl W. Cook
*Attorney, Agent, or Firm*—Craig & Antonelli

[57] ABSTRACT

For recording analog information, a voltage is applied to a ferroelectric material plate as a synchronizing signal, the voltage having an amplitude equal at least to that of the threshold voltage for switching the polarization of the ferroelectric material plate and having a time width which is greater than the switching period of the polarization of the ferroelectric material, corresponding to the amplitude. A quantity of switching charge is modulated in proportion to the gradation of the analog information signal, the switching charge flowing through an external circuit which is connected in series with a ferroelectric material plate.

10 Claims, 13 Drawing Figures

FERROELECTRIC ANALOG MEMORY DEVICE AND METHOD OF OPERATING THE SAME

FIELD OF THE INVENTION

The present invention relates to a technique and apparatus for operating an analog memory device which employs ferroelectric material.

BACKGROUND OF THE INVENTION

As used in the present specification, the expression "analog memory device" corresponds to a device into which analog information (information such as a television image, which has a gradation corresponding to the brightness of a picture signal) can be written in conformity with the density of the information signal in analog form.

In general, ferroelectric material has the property that a domain having the same sign or polarity as that of the voltage applied to the material grows therewith. When the applied voltage is interrupted in the course of a change of the domain of the ferroelectric material, the growth of the domain ceases. Accordingly, the charge-versus-electric field variation of the ferroelectric material is not discontinuous, but is continuous. In other words, the state of polarization of the ferroelectric material can take on any value between both positive and negative saturation charge levels.

In ferroelectric material, however, the portion which has saturation charges is in a state of saturation polarization, which exhibits a value determined in dependence upon the type of material. This means that the spontaneous polarization of the ferroelectric material is closely associated with the crystal structure and corresponds to a material constant. Accordingly, the magnitude of the spontaneous polarization of the unit cell of ferroelectric crystal material has a fixed value, while the polarity thereof will change in accordance with the sign of the applied voltage which exceeds a threshold value. Namely, even when the applied voltage is reduced to zero at any point in the midst of a polarization reversal (reversal of the polarity of spontaneous polarization), the spontaneous polarization of the unit cell will remain unchanged unless a voltage having an opposite polarity to that of the polarization and exceeding the threshold voltage is applied to the crystal. Namely, the spontaneous polarization of the ferroelectric material is considered to be bistable.

The spontaneous polarization of a unit cell is bistable in the above-described type of ferroelectric material, yet since the ferroelectric material has a domain structure, the polarization (charge) of the entire ferroelectric crystal can take on an arbitrary value between that of a positive saturation value and that of a negative saturation value (charge). Namely, depending upon the sign of the applied voltage, domains of both the same and opposite signs will grow and vanish, respectively (this phenomenon is termed domain switching). The mode in which the entire ferroelectric crystal becomes saturated at a positive or negative domain in correspondence with the applied voltage is called full switching, while the mode in which only a portion of the crystal has positive or negative domains and the other part has domains of the opposite sign is called partial switching.

When a digital memory is to be employed in a memory device employing ferroelectric material, the switching mode of full switching is adopted. When an analog memory is to be constructed of such ferroelectric material, partial switching is employed.

DESCRIPTION OF THE PRIOR ART

In one type of prior art ferroelectric analog memory device, input information is converted into an electric signal proportional to the magnitude or duration of a voltage, and this electric signal is applied to the ferroelectric crystal.

As is shown by curves A and B and C in FIG. 1, however, the coercive electric field $V_c$ in the charge Q-versus-voltage V characteristic of the ferroelectric material will vary in dependence upon the frequency (curves A, B and C are charge-versus-voltage characteristic curves at 0.01 Hz, 1 Hz and 100 Hz, respectively). The frequency dependence becomes a fatal disadvantage if the ferroelectric analog memory device is employed as a recording medium for analog information, which has a sound recording tape, for use over a wide frequency range.

Now considering the switching characteristics of the ferroelectric material, when a pulse voltage having a constant amplitude $v_a$ and a time width $\tau$ as shown in FIG. 2b, and having a polarity opposite to that of the original polarization state, is applied to a ferroelectric device which is in a saturation state, a switching current , illustrated in FIG. 2a, will flow to change the polarization. The period of time during which the switching current becomes zero after the application of the voltage to the ferroelectric device is termed the switching time (denoted by $t_s$). The switching time becomes shorter for a higher applied voltage.

Upon reversing the polarization in response to the application of a rectangular wave pulse voltage, the time width ($\tau$) of the rectangular wave pulse voltage is constant, the ferroelectric device has the property that the switching time $t_s$ is decreased by increasing the amplitude $v_a$ of the pulse voltage. Let it be presumed that the time width $\tau$ of the voltage is controlled to be set at a predetermined value. Letting $v'_{th}$ denote the threshold value of the amplitude of the voltage necessary in order to place the ferroelectric device in the full switching state, in response to a predetermined voltage width $\tau$, then for $v_a < v'_{th}$, partial switching will take place.

On the other hand, where the voltage width $\tau$ is varied while maintaining the amplitude $v_a$ of the pulse voltage at a constant value, the ferroelectric device undergoes full switching at the threshold value $\tau_{th}$ of the pulse width $\tau$. When $\tau < t_{th}$ the ferroelectric device undergoes partial switching. In this manner, the partial switching can be controlled either by the amplitude $v_a$ of the voltage or by the width $\tau$ of the voltage. By integrating the switching current $i_s$, which flows through an external circuit when the ferroelectric device is switched, a value equal to a variation $\Delta Q$ in a quantity of charge on the electrode plane of the device is obtained. As a result, the following equation holds:

$$\Delta Q = \int_0^{t_s} i_s dt \qquad (1)$$

Here $\Delta Q$ is expressed in terms of a variation $\Delta P$ of spontaneous polarization. As a result, $$\Delta P = \Delta Q / A \qquad (2)$$

where $A$ represents the area of an electrode of the ferroelectric device.

Where full switching is to be effected, the variation $\Delta Q$ in the quantity of charge on the electrode plane of the ferroelectric device is:

$$\Delta Q = 2 P_s A \qquad (3)$$

where $P_s$ denotes the spontaneous polarization of the ferroelectric device per unit area.

Considering now the initial state in which the mean value $\bar{P}$ of the quantity of polarization of the entire ferroelectric device is zero. The quantity of charge $\Delta Q$ which varies while the ferroelectric device is fully switched from the state $\bar{P} = 0$ to the state $\bar{P} = P_s A$ is expressed by:

$$\Delta Q = P_s A$$

$$\Delta Q = \int_0^{t_s} i_s dt \qquad (4)$$

For partial switching, the rate of variation of polarization $\bar{P} A/P_s A = \bar{P}/P_s$ corresponds to the ratio of partial switching.

Where, in order to write information into the ferroelectric memory device which has been erased, the memory device is partially switched by a predetermined analog input signal, it will exhibit the property that when it is driven or operated by the voltage control method, the coercive electric field will vary in dependence upon the frequency of the applied voltage and temperature. Accordingly, it is difficult to control the value $\bar{P}/P_s$ with the voltage drive method only.

As will be understood from Equation (4), $\bar{P}/P_s$ will vary in dependence upon the current $i$ which flows through the external circuit of the ferroelectric memory device. More specifically, $$\frac{\bar{P}}{P_s} = \frac{\int_0^\tau i dt}{\int_0^{t_s} i_s dt} \qquad (5)$$

One problem is preventing the switching current $i_s$ from being affected by the frequency of the input voltage or the temperature of the device.

SUMMARY OF THE INVENTION

The present invention has been developed in order to solve the above problem and include the following features.

1. As a synchronizing signal for a memory device, a voltage, the amplitude of which is greater than that of the lowest voltage $v_{th}$ necessary for switching the polarization of a predetermined ferroelectric analog memory device and the pulse width of which is greater than the switching time $t_s$ of the polarization for the particular voltage amplitude, is applied to the memory device.

2. In addition, the quantity of switching charge flowing through an external circuit connected in series with the memory device is controlled in proportion to a predetermined analog information signal.

An object of the invention is to provide an operating method and apparatus for a ferroelectric analog memory, which eliminates the frequency dependence in the hysteresis curves, in the case of employing a ferroelectric material for the analog memory device and by way of which predetermined analog information can be precisely memorized.

BRIEF DESCRIPTION OF THE DRAWINGS

FIG. 6b is a side view of the analog line memory device shown in FIG. 6a;

DETAILED DESCRIPTION OF THE INVENTION

Figure 3:
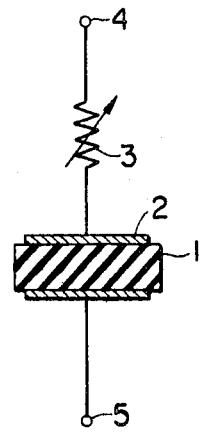
FIG. 3 is a diagram of the principle construction of an analog memory device in accordance with the present invention, employing a ferroelectric crystal.
Figure 2B:
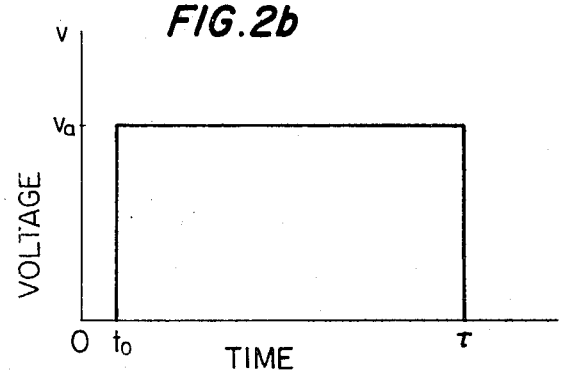
FIG. 2b is a wave form diagram showing the relationship between time and the voltage to be applied to the ferroelectric material when the polarization is reversed.

As is shown in FIG. 3, a resistance 3 is connected through an electrode 2 to a ferroelectric analog memory device plate 1 in series therewith. A pulse voltage having an amplitude $v_a$ and a duration $\tau$ is applied across terminals 4 and 5. At this time, the value of the amplitude $v_a$ of the pulse voltage is made greater than the lowest voltage value $v_{th}$ required to switch the device. If the value of the series resistance is zero, the device will undergo full switching. Even when the value of the series resistance is large, the voltage amplitude $v_a$ is initially applied to the device upon the impression of the pulse voltage ($v_a$, $\tau$). However, when the device begins to switch in response to the voltage $v_a$, a switching current $i$ flows to the external circuit, and the voltage drops by an amount $i \cdot R$ due to the series resistance R, with the result that the voltage applied to the device becomes ($v_a - i \cdot R$).

Figure 1:
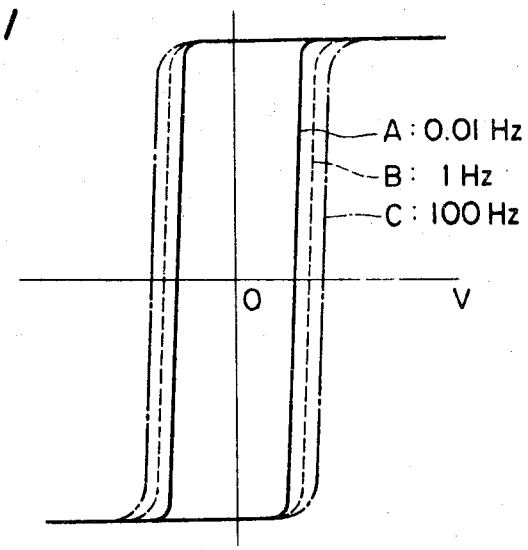
FIG. 1 is a characteristic diagram showing the frequency dependence of the correlation of charges versus applied voltage for a ferroelectric material.
Figure 2A:
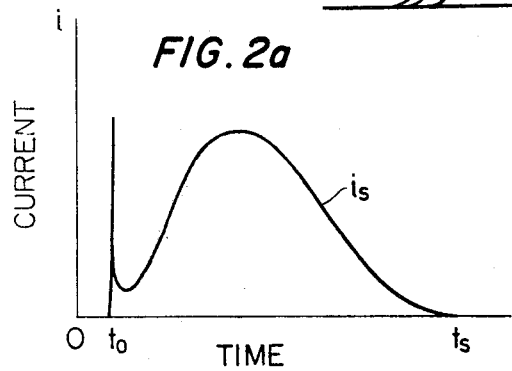
FIG. 2a is a characteristic diagram showing the correlation between time and the switching current which flows when the polarization of the ferroelectric material is switched.

The time variation of the switching current $i$ is shown in FIG. 2a, referred to previously. The area of the current wave form shown in FIG. 2a is the integrated value of the switching current. This corresponds to the total amount of charge which has flowed through the external circuit of the device and is equal to the quantity of switched polarization.

By replacing the wave shape of a switching current with a rectangular wave (rectangular current wave) having an area equal to that of the current wave form as well as the same switching time, and letting the average current of the rectangular wave form at this time be denoted by $\bar{i}$, and the duration $\tau$ of the pulse voltage impressed being set to be equal to the switching time $t_s$ of the device, then the threshold current (critical current) $\bar{i}_{th}$ necessary to cause full switching becomes:

$$\bar{i}_{th} = \frac{P_s A}{\tau} \qquad (6)$$

On the other hand, the switching current $\bar{i}$ varies in dependence on the magnitude of the series resistance whenever the voltage is maintained constant. The value of the series resistance for which Equation (6) holds, namely, the threshold resistance (critical resistance) $R_{th}$ for full switching is:

$$R_{th} = \frac{v_a - v_{th}}{\frac{P_s A}{\tau}} \qquad (7)$$

where $v_{th}$ corresponds to the lowest D.C. voltage ($\tau = \infty$) necessary for switching the polarization of the device.

Accordingly, if the series resistance R is:

$$R > R_{th} \qquad (8)$$

the polarization of the device undergoes partial switching.

Here, the relationship between the magnitude of the series resistance R and the ratio of the partial switching of the polarization of the device will be calculated.

When $R > R_{th}$, $t_s > \tau$. Letting $$\bar{i} = \frac{P_s A}{t_s} \qquad (9)$$

the mean value $\bar{P}$ of the polarization of the entire device becomes:

$$\bar{P} = \frac{\bar{i}\tau}{A} \qquad (10)$$

Using Equation (6), $$\frac{\bar{P}}{P_s} = \frac{\bar{i}}{\bar{i}_{th}} \qquad (11)$$

On the other hand, from Equations (9) and (10), $$\frac{\bar{P}}{P_s} = \frac{\tau}{t_s} \qquad (12)$$

The voltage drop due to the resistance R is:

$$\bar{i}R = v_a - v_s \qquad (13)$$

where $v_s$ represents the voltage drop which arises when the polarization of the device is switched.

Therefore, $$\bar{i} = \frac{v_a - v_s}{R} \qquad (14)$$

When the duration $\tau$ of the pulse voltage to be impressed on the device is equal to the switching time $t_s$ of the domain of the device, it follows that $$\bar{i}_{th} = \frac{P_s A}{\tau}.$$

By substituting this relation into Equation (7), $$R_{th} = \frac{v_a - v_{th}}{\frac{P_s A}{\tau}} = \frac{v_a - v_{th}}{\bar{i}_{th}}$$

$$\bar{i}_{th} = \frac{v_a - v_{th}}{R_{th}} \qquad (15)$$

Therefore, $$\frac{\bar{i}}{\bar{i}_{th}} = \frac{v_a - v_s}{v_a - v_{th}} \cdot \frac{R_{th}}{R} \qquad (16)$$

From Equation (11), $$R = R_{th} \frac{v_a - v_s}{v_a - v_{th}} \cdot \frac{P_s}{\bar{P}} \qquad (17)$$

In order to partially switch the domains of the device to a desired ratio $\bar{P}/P_s$, the resistance R may be selected so as to satisfy Equation (17). Since $v_a$ is sufficiently large in actuality, $$\frac{v_a - v_s}{v_a - v_{th}} \approx 1$$

holds. Therefore, $$R \approx R_{th} \frac{P_s}{\bar{P}} \qquad (18)$$

Further, from Equations (18) and (16), $$\frac{\bar{P}}{P_s} = \frac{\bar{i}}{\bar{i}_{th}}$$

Accordingly, as the switching current $i$ is varied by changing the value of the series resistance connected to the device, the quantity of charge ($\bar{P}$) for the partial switching can be controlled by the current $i$.

The foregoing explanation is the principle of the charge control system for effecting partial switching necessary for providing a ferroelectric analog memory device. It will be understood that the switching charge may be controlled in proportion to the input signal whenever a voltage which is sufficiently greater than the voltage necessary for full switching is applied to the memory device for a prescribed period of time.

In spite of the designation of the charge control, in actuality, the value of the resistance which is connected in series with the device may be changed in proportion to the voltage value of the input analog signal. Here, the resistance may be variable resistance for manual control, or a transistor for electrical control. Alternatively, the voltage value of the input signal is converted into a time value signal, the circuit is closed for a period of time proportional to the magnitude of the signal, and the charge proportional to the magnitude of the signal flows into the memory device. Here, a manual or electric switch, namely a mechanical switch or a transistor, may be turned on and off.

Embodiment 1:

In a first embodiment of the invention, PbO, $La_2O_3$, $TiO_2$ and $ZrO_2$ powders were weighed and mixed in a composition in accordance with the formula $Pb_{0.92}La_{0.08}(Zr_{0.65}Ti_{0.35})_{0.98}\cdot O_3$ (hereunder termed PLZT-8/65/35). After the mixture was calcined, it was kneaded well with a ball mill. The mixture was then dried and blended, to provide a raw material powder. Transparent ceramic material PLZT-8/65/35 was made in such a way that the raw material powder was hot-pressed for 20 hours at a temperature of 1200° C and a pressure of 2,000 psi.

A boule, hot-pressed to dimensions of a diameter of 20 mm and a thickness of 10 mm, was sliced into discs or wafers 0.5 mm thick. By optically polishing the sliced surfaces, each disc was finished to a transparent ceramic plate 0.2 mm thick. Each ceramic plate is a material in which the anti-ferroelectric phase and the ferroelectric phase coexist at room temperature. Moreover, the ceramic plate has the property that when a voltage is applied thereto, the ferroelectric phase is induced, to deprive the plate of transparency, with the result that light scattering becomes intense. The intensity of the scattering of light is determined by the proportion between the volumes which the anti-ferroelectric phase and the ferroelectric phase occupy in the ceramic plate. Since the polarization P is zero in the anti-ferroelectric phase, the quantity of polarization induced upon the application of an electric field varies in proportion to the area of the ferroelectric phase induced in the ceramic plate.

Figure 4A:
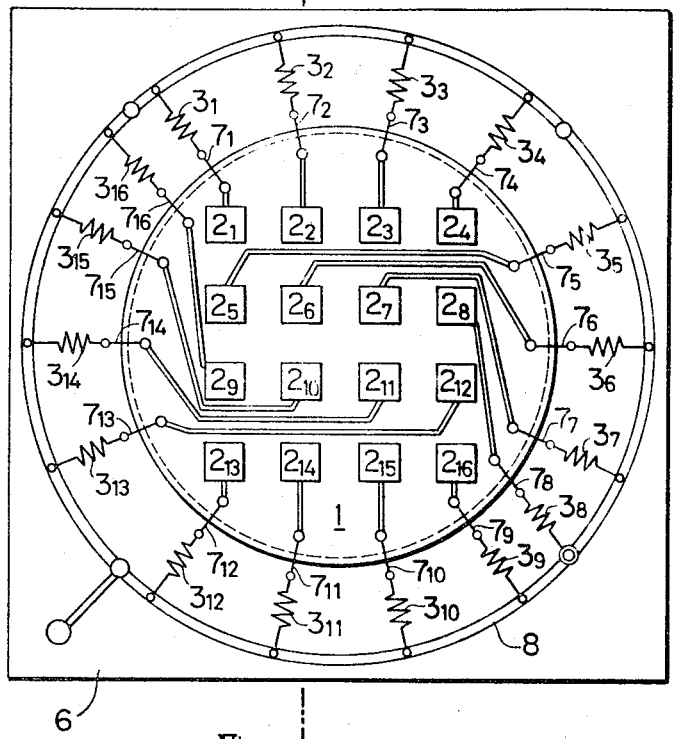
FIG. 4a is a plan view of an embodiment of the analog memory device in accordance with the invention employing a ferroelectric crystal.
Figure 4B:
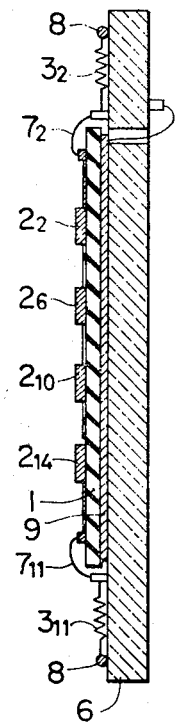
FIG. 4b is a vertical sectional view of the analog memory device shown in FIG. 4a taken along line IV$b$ — IV$b$.

An $In_2O_3$ - $SnO_2$ solid solution was deposited onto both the upper and lower surfaces of the above ceramic plate by sputtering. Thereafter, the $In_2O_3$ - $SnO_2$ film on the upper surface was subjected to photoetching to form transparent ($In_2O_3$ - $SnO_2$) electrodes $2_1$, $2_2$, $2_3$ . . . . ., $2_{15}$ and $2_{16}$ as shown in FIGS. 4a and 4b, each electrode having an area of 2 mm × 2 mm, at appropriate intervals. As is shown in FIGS. 4a and 4b, the transparent ceramic plate thus obtained was affixed to a supporting glass plate 6 by way of leads $7_1$, $7_2$, $7_3$ . . . . $7_{15}$ and $7_{16}$. Furthermore, it was connected to a main lead 8 by way of resistances $3_1$, $3_2$, $3_3$, . . . . ., $3_{15}$ and $3_{16}$.

The values of the resistances $3_1$, $3_2$, $3_3$, . . . . $3_{15}$ and $3_{16}$ were 20 kΩ, 22 kΩ, 24 kΩ, . . . . 48 kΩ and 50 kΩ, respectively. Namely, the values of the resistances increased every 2 kΩ from 20 kΩ.

Between the main lead 8 and the $In_2O_3$ - $SnO_2$ electrode 9 with which the entire lower surface is coated, a D.C. voltage of 200 volts was applied for one millisecond. Then, at those portions at which the electrodes $2_1$, $2_2$, $2_3$, . . . . . $2_{15}$ and $2_{16}$ were provided, the ferroelectric phases of the magnitudes inversely proportional to the respective resistances $3_1$, $3_2$, $3_3$, . . . . $3_{15}$ and $3_{16}$ were generated and scattered light was observed. The scattered light intensity was the highest at the part at which the resistance value 20 kΩ was connected and was the lowest at the part at which the resistance value 50 kΩ was connected. Accordingly, the quantity of light, transmitted through the ceramic plate with the above construction, was divided into 16 steps (4 bits) in inverse proportion to the magnitudes of the resistances which were respectively connected in series with the ceramic plate. As a result, 16 gradations could be displayed.

In the above-explained device, by employing resistances connected in series with the ceramic plate, an analog information signal having density gradations can be recorded in analog form in accordance with the magnitudes of the resistances. In this manner, the ferroelectric phase can be partially switched within the anti-ferroelectric phase, and analog information can be displayed. Furthermore, the shaded pattern displayed is stably maintained even after the voltage pulse disappears. It is, therefore, apparent that the function of the analog memory device is achieved. The information which is written in the foregoing manner can be erased merely by impressing, on the main lead, a voltage which has a polarity opposite that of the voltage employed for writing the information.

In order to record picture information, an analog memory device having a large storage capacity is necessary. A matrix device employing ferroelectric material can be utilized for this purpose.

In writing picture information in analog form into the ferroelectric matrix device, the voltage coincidence method is adopted in which half voltages having magnitudes $+(V/2)$ and $-(V/2)$ are respectively applied in the horizontal and vertical directions from the front and back surfaces of the matrix elements, while the full voltage is applied to the matrix element located at a position corresponding to an intended picture signal. Therefore, a pulse voltage for writing information is half the predetermined voltage and has a constant amplitude $v_a$.

Figure 5:
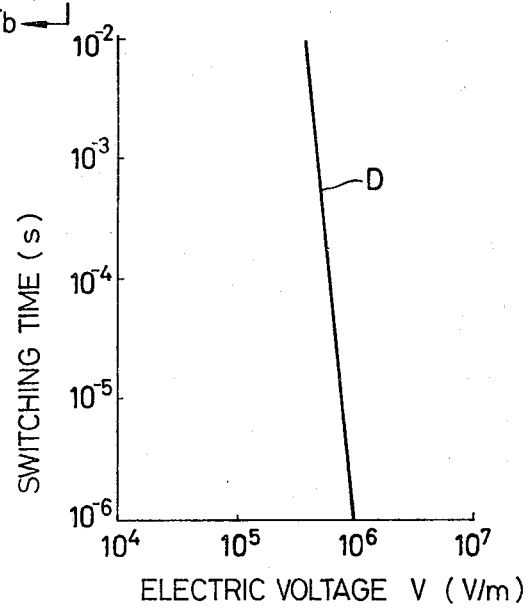
FIG. 5 is a switching characteristic diagram of a matrix element employing a PLZT (La-modified, lead zirconate titanate)

In ferroelectric matrix devices, conventional ferroelectric material such as barium titanate and triglycine sulfate have poor nonlinearity switching characteristics ($t_s = \gamma E^{-n}$ where $n$ denotes the index of nonlinearity, $E$ the electric field, and $\gamma$ is a constant, with $n = 2$ for barium titanate and $n = 1.5$ for triglycine sulfate). For this reason, it has not always been possible to construct a matrix device of large storage capacity. In contrast therewith, PLZT has an index of nonlinearity of about 10, so that a matrix device having a large storage capacity can be constructed. The switching characteristic of PLZT is shown by the straight line D in FIG. 5. The vertical axis corresponds to the switching time $t_s$, which is understood to be inversely proportional to the tenth power of the magnitude of the electric field V applied to the matrix device; the magnitude of the electric voltage being indicated along the horizontal axis. The relationship can be established by the following formula:

$$\frac{1}{t_s} = V^{10} \qquad (19)$$

where $t_s$ is represented in microseconds and $V$ in volts/μm. Since the immunity for a half voltage pulse is $2^{10} = 1,024$, up to a capacity of $1,000 \times 1,000$ bits can be stored by a line-at-a-time system.

Where picture information is stored in the ferroelectric matrix device at every bit, the writing time $t(B)$ per bit in a ferroelectric matrix of M rows and N columns becomes:

$$t(B) = (M \times N \times f)^{-1} \qquad (20)$$

where $f$ denotes the number of matrix writing times per unit time, or the frame number or field number (the number of composing image fields per second). From Equations (6) and (20), the current $\bar{i}_{th}$ for writing 1 bit is:

$$\bar{i}_{th} = P_s A \ (M \times N \times f) \tag{21}$$

Since the current increases in proportion to N, a large current is necessary for a large capacity matrix, and voltage drops across the electrodes, as well as the leads, become a serious problem. In order to avoid this drawback, line sequence writing is adopted.

In line sequence writing, information is written for every row and the writing current $\bar{i}_{th}$ per bit becomes:

$$\bar{i}_{th} = P_s A (M \times f) \tag{22}$$

This means that $i$ is $1/N$ of that in comparison with the writing current for writing at each bit. Namely, the writing time per bit may be N times longer.

For this reason, line sequence writing is advantageous when writing analog information in a ferroelectric memory device. Herein, it is necessary to once store input signals by an amount corresponding to the rows of the matrix, by use of a line memory, and to subsequently write the signals into a prescribed line of the matrix at a time. A line memory has also been constructed with ferroelectric material and analog information could be recorded by the current control method. This method will be explained in Embodiment 2 below.

Embodiment 2:

A c-plate crystal of barium titanate $BaTiO_3$) was precisely polished to form a flat c-plane surface on opposite sides of the crystal. Thus, a barium titanate c-plate 100 microns in thickness and at least 10 mm long was prepared. The plate was then immersed in hot phosphoric acid at 150° C to provide a parallel flat plate 20 microns in thickness.

A frame-shaped electrode, the respective sides of which were parallel to the <100> direction and were 100 microns wide was provided on the back c-surface of the barium titanate parallel flat plate. The frame-shaped electrode was a gold evaporated film on a foundation of chromium, hereinafter referred to as Cr - Au evaporated film.

Figure 6A:
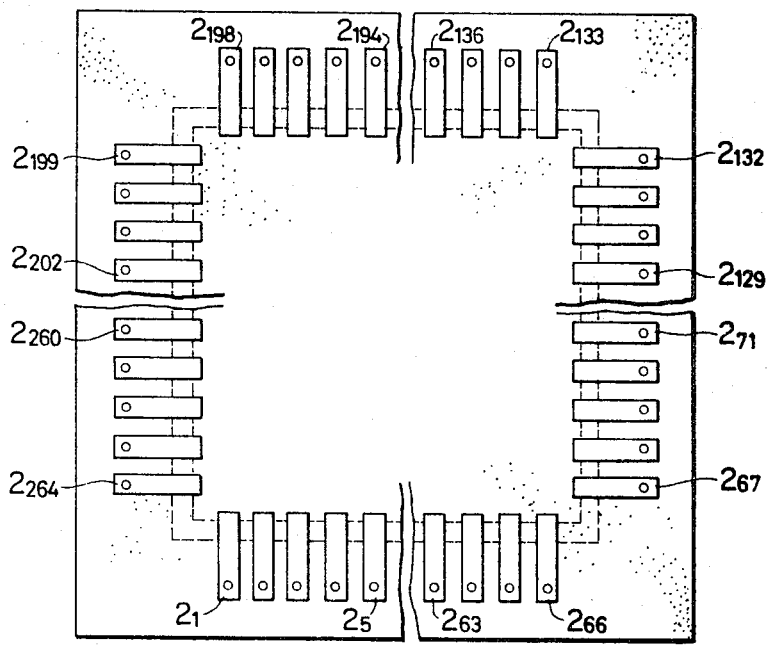
FIG. 6a is a plan view of an analog line memory device in accordance with the present invention employing a ferroelectric crystal.
Figure 6B:
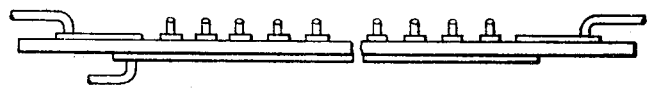

On the other side of the plate, stripe-shaped Cr - Au evaporated electrodes $2_1$, $2_2$, $2_3$, . . . . . $2_{263}$ and $2_{264}$, each having a width of 100 μm were provided on the front c-surface, at positions corresponding to the respective sides of the frame-shaped electrode on the back c-surface, in such a manner that 66 of the electrodes were distributed along each side, as shown in FIGS. 6a and 6b.

Figure 7:
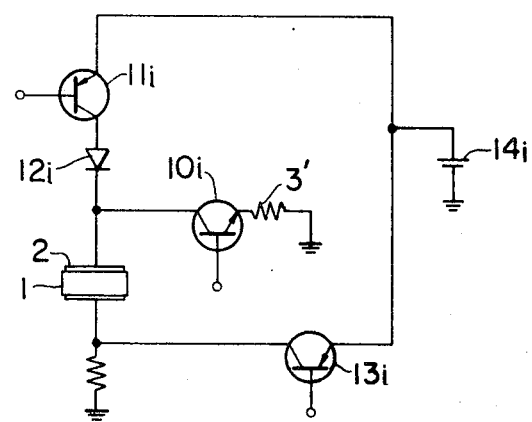
FIG. 7 is a circuit diagram of a circuit connected to each of the electrodes of the analog line memory device shown in FIGS. 6a and 6b.

As is shown in FIG. 7 (this Figure shows an electric circuit connected to the $i$-th stripe-shaped electrode $2_i$), a high withstand voltage transistor $10_i$ (including a negative resistance 3') and a transistor $11_i$ and a diode $12_i$ are connected to each of the stripe-shaped Cr - Au evaporated electrodes. The frame-shaped electrode on the back c-surface is connected to a grounding resistance and to a large current transistor $13_i$. Transistors $11_i$ and $13_i$ are connected to power source $14_i$ of 24 volts. Furthermore, the base of transistor $11_i$ is connected to a write-in circuit, so that a read-out signal is delivered to resistance 3' by way of transistor $10_i$. Since the driving circuit elements including the current control elements $11_i$ are equivalent for all bits, FIG. 7, therefore, corresponds to the circuit for only a single bit. Predetermined video signals are received at the terminals of transistor $11_i$ and at 240 nanoseconds time intervals the video signals are successively applied to the bases of the transistors of the current control elements $11_1 - 11_{264}$ connected to the stripe-shaped electrodes on the front c-surface.

The current control element is, so to speak, an analog current gate, operating for a prescribed time width, and the picture signals are sequentially and accurately memorized in memory device 1. After writing the information corresponding to a single scanning line, the large current transistors $13_i$ and the high voltage transistor $10_i$ are operated to open the gates within a retrace interval as picture signal input gates are maintained "off". The picture signals stored in the memory device appear as output voltages at the respective resistances 3' simultaneously. The gates which are connected to the respective columns of the memory matrix are opened by the voltages, so that the video signals are written into the corresponding columns of the matrix. Since, at this time, the line memory for storing information corresponding to one scanning line of the picture signals has been erased, the picture signals corresponding to the next scanning line can be stored. In this manner, according to the line memory device of this embodiment, picture signals can be stored every other scanning line. In this case, only half the video signals corresponding to 525 scanning lines are memorized. Needless to say, if all of the information is necessary, two line memories may be employed and may be alternately addressed, such as by way of a bistable multivibrator.

Figure 8B:
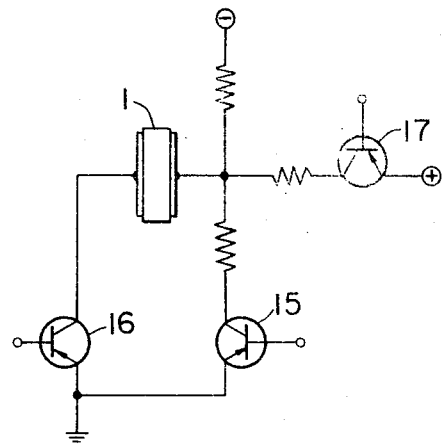
FIG. 8b is an equivalent circuit diagram of one of the elements of analog memory shown in FIG. 9.
Figure 8A:
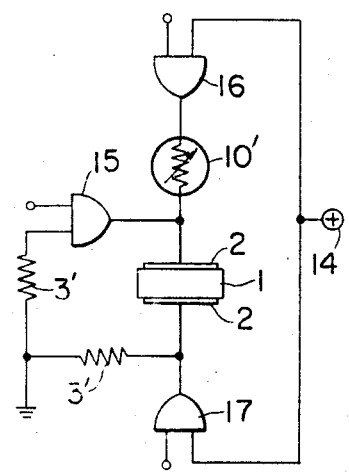
FIG. 8a is an equivalent circuit diagram of an analog line memory employing the device shown in FIGS. 6a and 6b and the electric circuit shown in FIG. 7.

As thus far described, the line memory in which the current control elements are coupled with the ferroelectric material is very useful. An equivalent circuit of the line memory is shown in FIG. 8a. In FIG. 8a, memory device 1 has respective electrodes 2 on opposite sides thereof, while gates 15, 16 and 17 are coupled to the electrodes. A current control element 10' is connected between the output of gate 16 and the upper electrode of the memory device 1. Where a PLZT plate is employed in place of the barium titanate crystal c-plate, the direction is no problem since the material is ceramic.

Embodiment 3:

From a boule of $Pb_{0.92}La_{0.078}(Zr_{0.7}Ti_{0.3})_{0.88}.O_3$ (hereinbelow termed PLZT-7.8/70/30) obtained by hot-pressing material in the same manner as discussed above in connection with PLZT-8/65/35 in Embodiment 1, a transparent ceramic plate, the upper and lower surfaces of which were optically polished, was prepared having dimensions of 20 mm × 20 mm × 0.2 mm.

On each of the upper and lower principal surfaces of the transparent ceramic plate, an $In_2O_3 - SnO_2$ film was photoetched into 35 band-shaped electrodes, having intervals of 0.5 mm and each of which having a width of 0.4 mm. The band-shaped electrodes on the front surface of the plate were disposed to be orthogonally projected onto the electrodes on the back surface of the plate so as to provide horizontal and vertical line electrodes on opposite surfaces of the plate.

Figure 9:
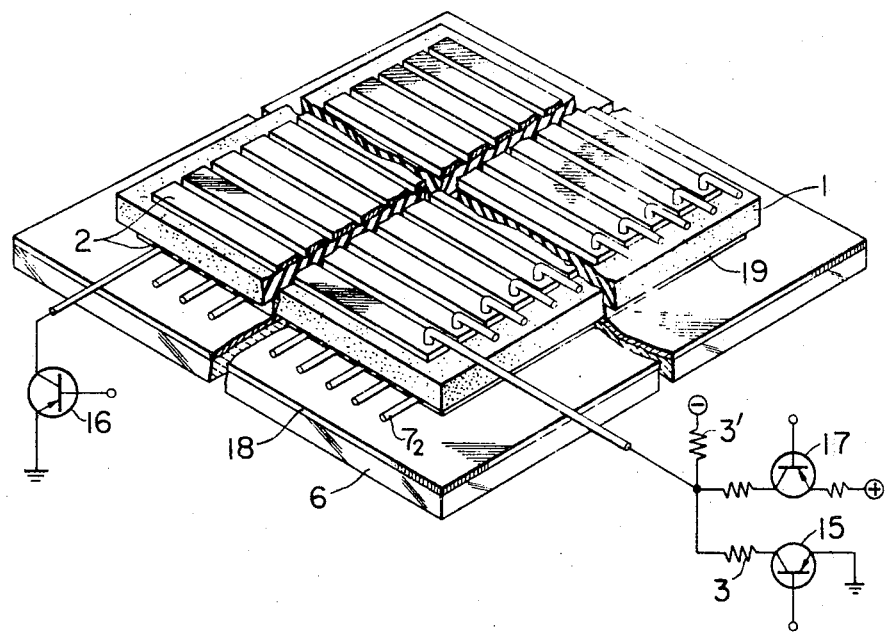
FIG. 9 is a partial perspective view of a further embodiment of the analog memory device in accordance with the present invention employing a ferroelectric crystal.

As is illustrated in FIG. 9, leads $7_1$ and $7_2$ were connected in series with all the electrodes in the horizontal and vertical directions, respectively. These electrodes are fixed by way of mica onto a glass substrate 6 coated with a heating transparent electrode 18.

Each horizontal line electrode has a resistance 3 and a gate transistor 15 connected in series therewith to ground. The line electrode is also connected to a +50 volt power source through gate transistor 17 and to a power source of −180 volts through a resistance 3′. Each vertical line is connected by way of a current control transistor 16 to ground.

Video signals, corresponding to desired analog input signals, are supplied to the current control element 16 and are written into the device in the line-at-a-time mode.

The PLZT - 7.8/70/30 material employed in this embodiment exhibits anti-ferroelectric properties and has no memory action at room temperature.

In the device, gate transistors 15 and 17 for the horizontal line electrodes are enabled and the horizontal line electrodes have potentials of 180 volts applied thereto and current controlled in accordance with the input signals supplied by the current control elements falling into all of the elements of a predetermined horizontal line. Then, the ferroelectric states of the magnitudes proportional to the current values are induced in the respective elements, so that incident light is scattered. In this manner, currents corresponding to the input signals flow into each horizontal line of the elements at the same time, to write information for one horizontal line. Then, the operation transfers to the writing stage of the next horizontal line. At this time, gate transistors 15 are cut off, and the potential of the horizontal line with the signals stored therein is held at 120 volts. Thus, a matrix pattern conforming to the input signals is progressively written into the elements of the respective horizontal lines and light scattering conforming to the pattern can be carried out.

The ferroelectric states stored into the respective horizontal lines of the elements are stably maintained at the bias voltage of 120 volts.

A period of time until the next erasure of the picture elements is made equal to the picture composing period of time. Before writing the next picture, gate transistors 17 of the particular horizontal line are turned on, and the potential of the horizontal line electrodes is maintained at +50 volts for a horizontal scanning period 1H. Simultaneously therewith, gate transistors 16 of all the vertical lines are turned on, and the reverse voltage is applied to all of the elements of the horizontal line, to quickly erase the information in the previous picture written into the horizontal line. Since the video signals are written into the line memory at this time, the horizontal lines of the matrix repeat erasure, writing and erasure, writing every horizontal scanning time. Therefore, th video signals are displayed every second horizontal line. Thus, when new picture information is to be rewritten into the same horizontal line, the previous picture of the horizontal line has been fully erased. An equivalent circuit of the drive circuit for this embodiment for 1 bit is shown in FIG. 8b.

Since the memory matrix device of this enbodiment has a small capacity of 10 × 10 bits, it cannot display an entire television picture image. When combined with the line memory device of Embodiment 2, it is capable of displaying a portion of the picture by reducing the television picture image by 8 × 8, as a clear picture at an image frame number f of 10.

The current controlling transistor in this embodiment was employed as a current saturation element. A sufficiently large voltage at which the transistor was saturated and could cause only a fixed current to flow was applied to the base of the transistor. The application period of time was controlled by output voltages which were obtained by transforming the video signals into 16 steps of time widths by analog-to-digital conversion.

Thus, from the above embodiment, a televison employing ferroelectric material can be realized.

While I have shown and described several embodiments in accordance with the present invention it is understood that the same is not limited thereto but is suceptible of numerous changes and modifications known to a person skilled in the art and I therefore do not wish to be limited to the details shown and described herein but intend to cover all such changes and modifications as are obvious to one of ordinary skill in the art.

I claim:
1. A method of recording analog information comprising the steps of:
    a. applying a voltage to a plate of ferroelectric material as a synchronizing signal, said voltage having an amplitude equal at least to that of the threshold voltage of said material to switch the state of polarization of said plate and having a time width greater than the polarization switching period of said plate which corresponds to said amplitude; and
    b. modulating the quantity of switching charge flowing through said plate by an external current control circuit connected in series with said plate, said step of modulating being carried out in proportion to the gradation of said analog information, whereby a signal representative of said analog information is stored in said plate of ferroelectric material.

2. A ferroelectric analog memory comprising:
at least one plate of ferroelectric material;
electrodes having predetermined shapes respectively disposed on the upper and lower surfaces of said at least one plate;
charge control means, connected to one of said electrodes, for controlling the flow of charges therethrough to said electrode in an amount proportional to a predetermined input signal voltage; and
means, coupled to the electrodes on the upper and lower surfaces of said plate, for applying a voltage across said plate representative of prescribed analog information.

3. An apparatus for recording analog information comprising:
a plate of ferroelectric material having electrodes disposed on the opposite surfaces thereof;
first means, coupled in series with said electrodes, for applying to said plate a voltage, the amplitude of which is equal at least to the threshold voltage necessary for switching the state of polarization of said plate of ferroelectric material and having a time width greater than the period for switching the state of polarization of said plate of ferroelectric material which corresponds to said amplitude; and
second means, coupled to said first means, for modulating the quantity of switching charge flowing between said electrodes in proportion to the gradation of analog information to be recorded, whereby a signal representative of said analog information is stored in said plate of ferroelectric material.

4. An apparatus for recording analog information comprising:

a plate of ferroelectric material having electrodes disposed on the opposite surfaces thereof;

first means, coupled in series with said electrodes, for applying to said plate a voltage, the amplitude of which is equal at least to the threshold voltage necessary for switching the state of polarization of said plate of ferroelectric material and having a time width greater than the period for switching the state of polarization of said plate of ferroelectric material which corresponds to said amplitude; and second means, coupled to said first means, for modulating the quantity of switching charge flowing between said electrodes in proportion to the gradation of analog information to be recorded, whereby a signal representative of said analog information is stored in said plate of ferroelectric material, wherein said second means comprises at least one resistance element, the resistance of which is inversely proportional to the gradation of said analog information to be recorded.

5. An apparatus for recording analog information comprising:

a plate of ferroelectric material having electrodes disposed on the opposite surfaces thereof;

first means, coupled in series with said electrodes, for applying to said plate a voltage, the amplitude of which is equal at least to the threshold voltage necessary for switching the state of polarization of said plate of ferroelectric material and having a time width greater than the period for switching the state of polarization of said plate of ferroelectric material which corresponds to said amplitude; and second means, coupled to said first means, for modulating the quantity of switching charge flowing between said electrodes in proportion to the gradation of analog information to be recorded, whereby a signal representative of said analog information is stored in said plate of ferroelectric material, wherein said plate of ferroelectric material is a plate of PLZT-ceramic.

6. An apparatus for recording analog information comprising:

a plate of ferroelectric material having electrodes disposed on the opposite surfaces thereof;

first means, coupled in series with said electrodes, for applying to said plate a voltage, the amplitude of which is equal at least to the threshold voltage necessary for switching the state of polarization of said plate of ferroelectric material and having a time width greater than the period for switching the state of polarization of said plate of ferroelectric material which corresponds to said amplitude; and second means, coupled to said first means, for modulating the quantity of switching charge flowing between said electrodes in proportion to the gradation of analog information to be recorded, whereby a signal representative of said analog information is stored in said plate of ferroelectric material, wherein said ferroelectric material is a plate of barium titanate.

7. An apparatus for recording analog information comprising:

a plate of ferroelectric material having electrodes disposed on the opposite surfaces thereof;

first means, coupled in series with said electrodes, for applying to said plate a voltage, the amplitude of which is equal at least to the threshold voltage necessary for switching the state of polarization of said plate of ferroelectric material and having a time width greater than the period for switching the state of polarization of said plate of ferroelectric material which corresponds to said amplitude; and second means, coupled to said first means, for modulating the quantity of switching charge flowing between said electrodes in proportion to the gradation of analog information to be recorded, whereby a signal representaive of said analog information is stored in said plate of ferroelectric material, wherein said second means comprises at least one analog gate circuit connected in series with at least one of said electrodes.

8. An apparatus for recording analog information comprising:

a plate of ferroelectric material having electrodes disposed on the opposite surfaces thereof;

first means, coupled in series with said electrodes, for applying to said plate 9 voltage, the amplitude of which is equal at least to the threshold voltage necessary for switching the state of polarization of said plate of ferroelectric material and having a time width greater than the period for switching the state of polarization of said plate of ferroelectric material which corresponds to said amplitude; and second means, coupled to said first means, for modulating the quantity of switching charge flowing between said electrodes in proportion to the gradation of analog information to be recorded, whereby a signal representative of said analog information is stored in said plate of ferroelectric material, wherein said second means comprises a first current control circuit connected between a source of analog information signals and one of said electrodes, and a second current control circuit connected between another of said electrodes, and a first source of reference potential.

9. An apparatus according to claim 8, further including a third current control circuit connected between said another of said electrodes and a second source of reference potential.

10. An apparatus for recording analog information comprising:

a plate of ferroelectric material having electrodes disposed on the opposite surfaces thereof;

first means, coupled in series with said electrodes, for applying to said plate a voltage, the amplitude of which is equal at least to the threshold voltage necessary for switching the state of polarization of said plate of ferroelectric material and having a time width greater than the period for switching the state of polarization of said plate of ferroelectric material which corresponds to said amplitude; and second means, coupled to said first means, for modulating the quantity of switching charge flowing between said electrodes in proportion to the gradation of analog information to be recorded, whereby a signal representative of said analog information is stored in said plate of ferroelectric material, wherein said electrodes comprises respective rows and columns of stripe-shaped electrode segments orthogonally disposed in opposite surfaces of said plate.

* * * * *